(12) United States Patent
Brandl et al.

(10) Patent No.: US 10,297,537 B2
(45) Date of Patent: May 21, 2019

(54) LEAD FRAME AND METHOD OF PRODUCING A CHIP HOUSING

(71) Applicant: OSRAM Opto Semiconductors GmbH, Regensburg (DE)

(72) Inventors: Martin Brandl, Kelheim (DE); Tobias Gebuhr, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/541,765

(22) PCT Filed: Jan. 7, 2016

(86) PCT No.: PCT/EP2016/050221
§ 371 (c)(1),
(2) Date: Jul. 6, 2017

(87) PCT Pub. No.: WO2016/110545
PCT Pub. Date: Jul. 14, 2016

(65) Prior Publication Data
US 2018/0005924 A1 Jan. 4, 2018

(30) Foreign Application Priority Data
Jan. 9, 2015 (DE) .................... 10 2015 100 262

(51) Int. Cl.
*H01L 23/495* (2006.01)
*H01L 33/00* (2010.01)
(Continued)

(52) U.S. Cl.
CPC .. *H01L 23/49544* (2013.01); *H01L 23/49503* (2013.01); *H01L 23/49562* (2013.01);
(Continued)

(58) Field of Classification Search
CPC ... H01L 23/49544; H01L 24/97; H01L 33/62; H01L 23/49503; H01L 23/49562; H01L 33/0095
See application file for complete search history.

(56) References Cited

U.S. PATENT DOCUMENTS 4,870,474 A  9/1989 Karashima
5,789,806 A  8/1998 Chua et al.
(Continued)

FOREIGN PATENT DOCUMENTS

DE   102012104882 A1  12/2013
DE   10 2013 211 233 A1  12/2014
(Continued)

OTHER PUBLICATIONS

German Search Report in corresponding German Patent Application No. 10 2015 100 262.0 dated Jul. 29, 2015.
(Continued)

*Primary Examiner* — Jose R Diaz
(74) *Attorney, Agent, or Firm* — DLA Piper LLP (US)

(57) ABSTRACT

A lead frame used to produce a chip package includes a first lead frame section and a second lead frame section connected to one another by a bar, wherein the bar includes a first longitudinal section, a second longitudinal section and a third longitudinal section, the first longitudinal section adjoins the first lead frame section and the third longitudinal section adjoins the second lead frame section, the first longitudinal section and the third longitudinal section are oriented parallel to one another, the first longitudinal section and the second longitudinal section form an angle not equal to 180° and not equal to 90°, and the lead frame is planar.

8 Claims, 5 Drawing Sheets

(51) Int. Cl.
*H01L 33/62* (2010.01)
*H01L 23/00* (2006.01)
*H01L 33/48* (2010.01)
*H01L 21/56* (2006.01)

(52) U.S. Cl.
CPC .......... *H01L 24/97* (2013.01); *H01L 33/0095* (2013.01); *H01L 33/62* (2013.01); *H01L 21/561* (2013.01); *H01L 33/486* (2013.01); *H01L 2224/48091* (2013.01); *H01L 2924/0002* (2013.01); *H01L 2924/12041* (2013.01); *H01L 2933/0033* (2013.01)

(56) References Cited

U.S. PATENT DOCUMENTS

| 2008/0157297 | A1 | 7/2008 | Kudoh | |
|---|---|---|---|---|
| 2008/0224161 | A1 | 9/2008 | Takada | |
| 2011/0256646 | A1 | 10/2011 | Lin | |
| 2013/0316500 | A1* | 11/2013 | Ota | ............................... 438/119 |
| 2016/0190115 | A1* | 6/2016 | Shigematsu | ............ H01L 24/97 438/123 |
| 2018/0005924 | A1* | 1/2018 | Brandl | .............. H01L 23/49544 |
| 2018/0033758 | A1* | 2/2018 | Samson | .................. H01L 24/27 |

FOREIGN PATENT DOCUMENTS

| JP | 57-118658 A | 7/1982 |
|---|---|---|
| JP | 03-77356 A | 4/1991 |
| JP | 05-190891 A | 7/1993 |
| JP | 2013-232508 A | 11/2013 |
| JP | 2014-150244 A | 8/2014 |
| WO | 2013/092308 A1 | 6/2013 |
| WO | 2013/182358 A1 | 12/2013 |

OTHER PUBLICATIONS

Notice of Reasons for Rejection of corresponding JP 2017-531726 dated Jul. 3, 2018, and English translation.

Decision on Examination dated Feb. 18, 2017, of corresponding Taiwanese Application No. 104144362, in English.

* cited by examiner

LEAD FRAME AND METHOD OF PRODUCING A CHIP HOUSING

TECHNICAL FIELD

This disclosure relates to a lead frame used to produce a chip package, a method of producing a chip package, and a method of producing an optoelectronic component.

BACKGROUND

It is known to produce packages of electronic components, for example, optoelectronic components by embedding a lead frame in a molded body. Such lead frames have individual lead frame sections connected to one another by bars that are cut through in a subsequent processing step.

It could therefore be helpful to provide a lead frame used to produce a chip package, a method of producing a chip package, and a method of producing an optoelectronic component.

SUMMARY

We provide a lead frame used to produce a chip package including a first lead frame section and a second lead frame section connected to one another by a bar, wherein the bar includes a first longitudinal section, a second longitudinal section and a third longitudinal section, the first longitudinal section adjoins the first lead frame section and the third longitudinal section adjoins the second lead frame section, the first longitudinal section and the third longitudinal section are oriented parallel to one another, the first longitudinal section and the second longitudinal section form an angle not equal to 180° and not equal to 90°, and the lead frame is planar.

We also provide a method of producing a chip package including providing the lead frame used to produce a chip package including a first lead frame section and a second lead frame section connected to one another by a bar, wherein the bar includes a first longitudinal section, a second longitudinal section and a third longitudinal section, the first longitudinal section adjoins the first lead frame section and the third longitudinal section adjoins the second lead frame section, the first longitudinal section and the third longitudinal section are oriented parallel to one another, the first longitudinal section and the second longitudinal section form an angle not equal to 180° and not equal to 90°, and the lead frame is planar; embedding the lead frame in a molded body; and dividing the molded body and the lead frame, the bar being cut through.

We further provide a method of producing an optoelectronic component including producing a chip package by the method of producing a chip package including providing the lead frame used to produce a chip package including a first lead frame section and a second lead frame section connected to one another by a bar, wherein the bar includes a first longitudinal section, a second longitudinal section and a third longitudinal section, the first longitudinal section adjoins the first lead frame section and the third longitudinal section adjoins the second lead frame section, the first longitudinal section and the third longitudinal section are oriented parallel to one another, the first longitudinal section and the second longitudinal section form an angle not equal to 180° and not equal to 90°, and the lead frame is planar; embedding the lead frame in a molded body; and dividing the molded body and the lead frame, the bar being cut through; and arranging an optoelectronic semiconductor chip on a section of the lead frame.

LIST OF REFERENCES 10 first optoelectronic component
20 second optoelectronic component
100 lead frame
101 upper side
110 first column
120 second column
130 third column
140 first row
150 second row
160 first vertical separating plane
165 second vertical separating plane
170 first horizontal separating plane
175 second horizontal separating plane
200 lead frame section
201 outer edge
210 anode section
220 cathode section
230 section pair
300 bar
301 first bar
302 second bar
303 third bar
304 fourth bar
305 fifth bar
310 first longitudinal section
320 second longitudinal section
330 third longitudinal section
340 angle
400 molded body
410 molded body section
420 cavity
500 optoelectronic semiconductor chip
501 upper side
510 bonding wire
600 chip package
1100 lead frame

DETAILED DESCRIPTION

A lead frame used to produce a chip package comprises a first lead frame section and a second lead frame section connected to one another by a bar. The bar comprises a first longitudinal section, a second longitudinal section and a third longitudinal section. The first longitudinal section adjoins the first lead frame section. The third longitudinal section adjoins the second lead frame section. The first longitudinal section and the third longitudinal section are oriented parallel to one another. The first longitudinal section and the second longitudinal section make an angle not equal to 180°. The lead frame is configured in a planar fashion.

By virtue of the configuration of the bar that connects the lead frame sections, with the second longitudinal section angled off relative to the first longitudinal section of the bar and relative to the third longitudinal section of the bar, the bar forms a resiliently deformable flexural spring. The bar, acting as a flexural spring between the first lead frame section and the second lead frame section of the lead frame allows a resilient size variation of the lead frame in the plane of the lead frame. This makes it possible for the lead frame to adapt to a size variation induced by a temperature variation of a molded body in which the lead frame is embedded. In this way, stresses caused by the size variation of the molded body between the lead frame and the molded body are advantageously reduced so that warping of the molded body can also be reduced.

The second longitudinal section, arranged obliquely relative to the first longitudinal section and relative to the third longitudinal section, of the bar makes it possible to connect the first lead frame section and the second lead frame section of the lead frame to one another in a direction oriented neither parallel nor perpendicularly to the outer edges of the first lead frame section and of the second lead frame section. In this way, the lead frame can have an increased mechanical stability. In particular, it is thereby possible to avoid the lead frame having slits extending in a straight line over a plurality of lead frame sections. The resulting increased mechanical stability of the lead frame advantageously simplifies handling and processing of the lead frame, for example, during application of a coating onto the lead frame and during embedding of the lead frame in a molded body.

The first longitudinal section and the second longitudinal section also make an angle not equal to 90°. The effect of this is that the second longitudinal section and the third longitudinal section of the bar also make an angle not equal to 90°.

The first longitudinal section perpendicularly may adjoin an outer edge of the first lead frame section. This makes it possible to cut through the bar along a separating plane parallel to the outer edge of the first lead frame section, the separating plane extending through the first longitudinal section of the bar perpendicularly to the first longitudinal section of the bar. In this way, the cutting edge formed when cutting through the bar advantageously has a minimal cross-sectional area so that burr formation is reduced, a corrodible area is minimized and the risk of short circuits is minimized. Furthermore, the bar cutting edge formed in this way is arranged laterally next to the outer edge of the first lead frame section in a section of the chip package stabilized by the first lead frame section so that the risk of mechanical weakening of the chip package in the region of the cutting edge of the bar is reduced.

The third longitudinal section perpendicularly may adjoin an outer edge of the second lead frame section. This also makes it possible to cut through the bar along a separating plane parallel to the outer edge of the second lead frame section, the separating plane extending through the third longitudinal section of the bar perpendicularly to the third longitudinal section.

The first lead frame section may connect by further bars to further lead frame sections. In this case, all the further bars respectively comprise a first longitudinal section, a second longitudinal section and a third longitudinal section. All the first longitudinal sections of the further bars adjoin the first lead frame section. The first longitudinal section and the third longitudinal section of each further bar are respectively oriented parallel to one another. The first longitudinal section and the second longitudinal section of each further bar respectively make an angle not equal to 180°. Advantageously, the further bars therefore also act as resiliently deformable flexural springs and allow a size variation of the lead frame in the plane of the lead frame. By virtue of the plurality of bars, a mechanically stable connection of the lead frame sections of the lead frame is obtained.

The lead frame may be provided for the production of a QFN chip package. Lower sides of the first lead frame section and of the second lead frame section may then, for example, form solder contact pads of the chip package.

The lead frame may be provided for the production of a chip package for an optoelectronic component. For example, the lead frame may be provided for the production of a chip package for a light-emitting diode component.

Our method of producing a chip package comprises steps of providing a lead frame of the type described above, embedding the lead frame in a molded body, and dividing the molded body and the lead frame, the bar being cut through.

Advantageously, embedding the lead frame in the molded body during this method is facilitated by the high mechanical stability and connection stiffness of the lead frame. The variation in the size of the lead frame in the plane of the lead frame, made possible by the configuration of the bar as a flexural spring resiliently deformable in the plane of the lead frame. This advantageously allows the lead frame to adapt to a size variation induced, for example, by a temperature variation of the molded body after the embedding of the lead frame in the molded body so that stresses of the lead frame and of the molded body, caused by the size variation, and resulting undesired warping of the molded body are reduced.

In this method, division of the molded body and the lead frame is advantageously facilitated by the fact that the bar can be cut through along a separating plane oriented perpendicularly to the first longitudinal section or to the third longitudinal section of the bar and extends through the first longitudinal section or the third longitudinal section of the bar. The cutting surface of the bar, formed when cutting through the bar, therefore has a minimal size. This simultaneously offers the advantage that burr formation on the cutting surface of the bar is minimized, the size of the corrodible cutting surface of the bar is minimized and a risk of short circuit associated with formation of the cutting surface is reduced. The cutting surface of the bar, formed when cutting through the bar, is furthermore advantageously arranged laterally next to a lead frame section of the lead frame and therefore in a section of the molded body mechanically stabilized by this lead frame section so that the risk of mechanical weakening of the molded body in the region of the cutting surface is low.

The bar may be cut through in the first longitudinal section and/or in the third longitudinal section. Advantageously, this makes it possible to cut through the bar on a separating plane oriented parallel to outer edges of the lead frame sections of the lead frame and perpendicularly to the first longitudinal section and/or to the third longitudinal section of the bar.

The bar may be cut through in a direction oriented perpendicularly to the first longitudinal section of the bar. The cutting surface of the bar, formed when cutting through the bar, therefore advantageously has a minimal size.

Our method of producing an optoelectronic component comprises a method of producing a chip package of the type mentioned above and a further step of arranging an optoelectronic semiconductor chip on a section of the lead frame. The optoelectronic semiconductor chip may in this case, for example, be a light-emitting diode chip (LED chip). Advantageously, owing to the reduced susceptibility of the method of producing the chip package to error, a high yield can be achieved with this method. This allows the method to be carried out economically.

The above-described properties, features and advantages as well as the way in which they are achieved will become more clearly and readily comprehensible in conjunction with the following description of the examples, which will be explained in more detail in connection with the drawings.

Figure 1:
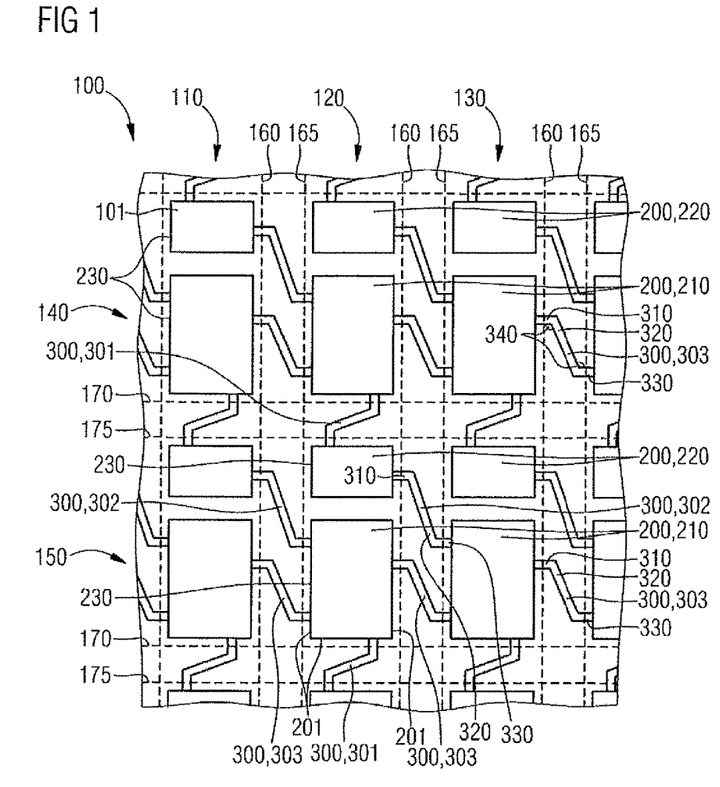
FIG. 1 schematically shows a plan view of a part of a lead frame.

FIG. 1 shows a schematic representation of a plan view of an upper side 101 of a lead frame 100. The lead frame 100 is provided for production of a multiplicity of chip packages. The chip packages may, for example, be used as packages for electronic components, in particular for optoelectronic components, for example, for light-emitting diode components (LED components). The chip packages may, for example, be QFN (Quad Flat No Leads) chip packages.

The lead frame 100 has an essentially flat and planar shape with an upper side 101 and a lower side lying opposite the upper side 101. The lead frame 100 may, for example, be produced from a thin metal sheet, for example, a copper sheet. The lead frame 100 comprises openings extending through the lead frame 100 from the upper side 101 of the lead frame to the lower side of the lead frame 100. The openings may, for example, have been formed by an etching or stamping method.

The lead frame 100 comprises an electrically conductive material, for example, copper. In addition, the surfaces of the lead frame 100 may comprise an electrically conductive coating (plating) of another electrically conductive material which may, for example, be used to improve wettability of the lead frame 100 with solder and/or to increase optical reflectivity of the lead frame 100. The coating of the lead frame 100 is preferably not applied until after openings extending through the lead frame 100 have been made so that the coating also covers the side edges of the lead frame 100 formed in the inner region of the openings.

The openings extending through the lead frame 100 subdivide the lead frame 100 into a multiplicity of lead frame sections 200 connected to one another by bars 300. The lead frame sections 200 of the lead frame 100 are arranged in a regular grid arrangement of which a first column 110, a second column 120, a third column 130, a first row 140 and a second row 150 are shown in FIG. 1. The lead frame 100 may comprise further columns and further rows. All the lead frame sections 200 and bars 300 of the lead frame 100 are arranged in a common plane.

The lead frame sections 200 of the lead frame 100 comprise anode sections 210 and cathode sections 220. All the anode sections 210 of the lead frame 100 are essentially configured identically to one another. All the cathode sections 220 of the lead frame 100 are also essentially configured identically to one another.

An anode section 210 and a cathode section 220 next to the anode section 210 respectively form a section pair 230 of the lead frame 100. A section pair 230 is arranged at each crossing point of a column 110, 120, 130 and of a row 140, 150 of the lead frame 100. All the section pairs 230 of the lead frame 100 are essentially configured identically to one another. Each section pair 230 of the lead frame 100 is intended for production of a chip package.

In the example shown in FIG. 1, the lead frame sections 200 of the lead frame 100 respectively have a rectangular shape with outer edges 201. In this example, the anode sections 210 are configured to be larger than the cathode sections 220, although this is not absolutely necessary. It is also possible to configure the lead frame sections 200 other than rectangularly, for example, with other polygonal shapes having outer edges 201.

Each lead frame section 200 of the lead frame 100 connects by bars 300 to a plurality of neighboring further lead frame sections 200. The anode section 210 and the cathode section 220 of a section pair 230, however, respectively connect to one another, not directly, but merely by neighboring lead frame sections 200 of neighboring section pairs 230.

The cathode section 220 of the section pair 230 arranged at the point of intersection of the second column 120 and of the second row 150 connects by a first bar 300, 301 to the anode section 210 of the section pair 230 arranged in the second column 120 and the first row 140. Furthermore, the cathode section 220 of the section pair 230 arranged in the second column 120 and the second row 150 connects by a second bar 300, 302 to the anode section 210 of the section pair 230 arranged in the third column 130 and the second row 150. The anode section 210 of the section pair 230 arranged in the second column 120 and the second row 150 connect by a third bar 300, 330 to the anode section 210 of the section pair 230 in the third column 130 and the second row 150.

All the further section pairs 230 of the lead frame 100 connect in a corresponding way by first bars 300, 301, second bars 300, 302 and third bars 300, 303 to the lead frame sections 200 of their neighboring section pairs 230. The anode section 210 of the section pair 230 in the second column 120 and the second row 150 is therefore additionally connected by a further first bar 300, 301 to the cathode section 220 of a section pair 230 arranged in the second column 120 and in a third row (only partially visible) of the lead frame 100. The anode section 210 of the section pair 230 in the second column 120 and the second row 150 furthermore connect by a further second bar 300, 302 to the cathode section 220 of the section pair 230 in the first column 110 and the second column 150. Furthermore, the anode section 210 of the section pair 230 in the second column 120 and the second row 150 connect by a further third bar 300, 303 to the anode section 210 of the section pair 230 in the first column 110 and the second row 150.

Each bar 300 of the lead frame 100 is configured as a bar extending along a longitudinal direction and extending from the one of the lead frame sections 200 connected by the bar 300 to the other of the lead frame sections 200 connected by the bar 300. Each bar 300 is subdivided in this case along its longitudinal direction into a first longitudinal section 310, a second longitudinal section 320 and a third longitudinal section 330. It is expedient for the individual longitudinal sections 310, 320, 330 respectively to be configured in a straight line. The first longitudinal section 310 adjoins the second longitudinal section 320. The second longitudinal section 320 adjoins the third longitudinal section 330. The first longitudinal section 310 adjoins an outer edge 201 of one of the lead frame sections 200 connected by the bar 300. The third longitudinal section 330 adjoins an outer edge 210 of the other of the lead frame sections 200 connected by the bar 300. Preferably, the first longitudinal section 310 and the third longitudinal section 330 respectively adjoin the outer edges 201 of the lead frame sections 200 connected by the respective longitudinal sections 310, 330 perpendicularly. In the example represented, the bars 300 are configured without branching.

The first longitudinal section 310 of the first bar 300, 301, that connects the cathode section 220 of the section pair 230 in the second column 120 and the second row 150 of the lead frame 100 to the anode section 210 of the section pair 230 in the third column 130 and the second row 150 of the lead frame 100, for example, adjoins an outer edge 201 of the cathode section 220 of the section pair 230 in the second column 120 and the second row 150 perpendicularly. The third longitudinal section 330 of this first bar 300, 301 adjoins an outer edge 201 of the anode section 210 of the section pair 230 in the third column 130 and the second row 150 of the lead frame 100 perpendicularly.

The first longitudinal section 310 and the third longitudinal section 330 of each bar 300 are oriented parallel to one another. The first longitudinal section 310 and the second longitudinal section 320 of each bar 300 make an angle 340 which is not equal to 180°. The second longitudinal section 320 and the third longitudinal section 330 of each bar 300 therefore also make this angle 340. Preferably, the angle 340 is also not equal to 90° and lies between 90° and 180°. In each bar 300, the second longitudinal section 320 is therefore arranged obliquely relative to the first longitudinal section 310 and relative to the third longitudinal section 330. The bars 300 have a bend in the transition regions between the first longitudinal section 310 and the second longitudinal section 320, and between the second longitudinal section 320 and the third longitudinal section 330.

The angle 340 may have different values in different bars 300. For example, the angle 340 may have a first value in all the first bars 300, 301, a second value in all the second bars 300, 302, and a third value in all the third bars 300, 303 of the lead frame 100.

In the example of the lead frame 100 as shown in FIG. 1, the bars 300 are respectively configured rotationally symmetrically relative to a rotation through an angle of 180° about a rotation point arranged in the second longitudinal section 320. It is, however, likewise possible to configure the first longitudinal sections 310 and the third longitudinal sections 330 of the bars 300 differently such that the bars 300 do not have rotational symmetry.

The first bars 300, 301 of the lead frame 100 connect lead frame sections 200 of section pairs 230 arranged in neighboring rows 140, 150 of the lead frame 100. The second bars 300, 302 and the third bars 300, 303 of the lead frame 100 connect lead frame sections 200 of section pairs 230 arranged in neighboring columns 110, 120, 130 of the lead frame 100. In the example of the lead frame 100 as shown in FIG. 1, all the bars 300, 301, 302, 303 are configured in the manner described with a first longitudinal section 310, a third longitudinal section 330 parallel to the first longitudinal section 310, and a second longitudinal section 320 which is arranged at the angle 340 relative to the first longitudinal section 310 and relative to the third longitudinal section 330. It would, however, also be possible, for example, only to configure the first bars 300, 301 or only the second bars 300, 302 and the third bars 300, 303 of the lead frame 100 in the manner described. In this case, for example, the other bars 300 of the lead frame 100 may be configured as rectilinear bars without angled-off middle sections.

Because of their angled configuration, the bars 300 of the lead frame 100 form resiliently deformable flexural springs. The bars 300 therefore allow resilient deformation of the lead frame 100 in a direction parallel to the plane of the lead frame 100 during which the individual lead frame sections 200 of the lead frame 100 are moved further away from one another and/or closer to one another.

Figure 2:
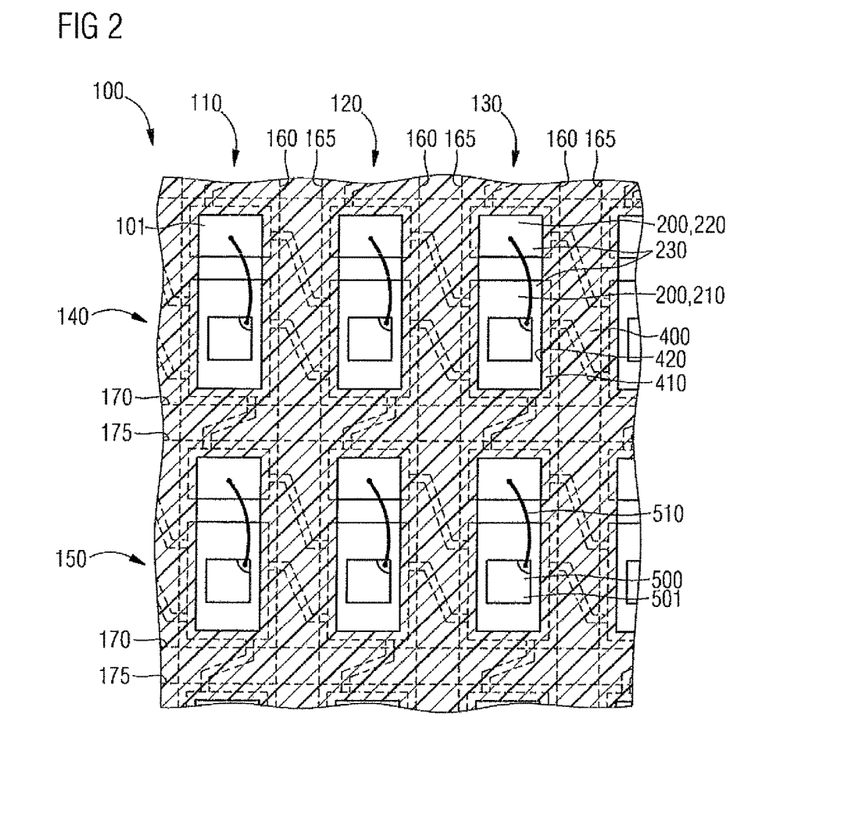
FIG. 2 schematically shows a plan view of a part of the lead frame after it has been embedded in a molded body.

FIG. 2 shows a schematized plan view of the lead frame 100 in a processing state chronologically following the representation of FIG. 1.

The lead frame 100 has been embedded in a molded body 400. The molded body 400 may also be referred to as a molding, or as a package body. The molded body 400 comprises an electrically insulating material, preferably a plastic material, for example, an epoxy resin. Embedding the lead frame 100 in the molded body 400 may, for example, be carried out by a molding process, in particular, for example, by transfer or injection molding. In this case, the lead frame 100 has had the material of the molded body 400 molded at least partially around it.

The molded body 400 covers a large part of the upper side 101 of the lead frame 100 and also extends into the openings of the lead frame 100. The lower side of the lead frame 100 may be partially or fully uncovered by the molded body 400.

On the upper side 101 of the lead frame 100, the molded body 400 comprises recesses forming cavities 420. In the regions of the cavities 420, the upper side 101 of the lead frame 100 is not covered by the material of the molded body 400. A cavity 420 is formed in the molded body 400 over each section pair 230 of the lead frame 100. In the region of this cavity, a part of the upper side 101 of the anode section 210 and a part of the upper side 101 of the cathode section 220 of the respective section pair 230 is respectively accessible and not covered by the material of the molded body 400.

After embedding the lead frame 100 in the molded body 400, an optoelectronic semiconductor chip 500 is respectively arranged in each cavity 420 of the molded body 400. The optoelectronic semiconductor chips 500 may, for example, be light-emitting diode chips (LED chips). Each optoelectronic semiconductor chip 500 has an upper side 501 and a lower side lying opposite the upper side 501. The upper side 501 may be a radiation emission surface of the optoelectronic semiconductor chip 500.

In the example shown in FIG. 2, each optoelectronic semiconductor chip 500 is arranged on that part of the anode section 210 of the respective section pair 230 exposed in the respective cavity 420. In this case, the lower side of the optoelectronic semiconductor chip 500 faces toward the anode section 210 and connects to the anode section 210 such that there is an electrically conductive connection between an electrical contact of the optoelectronic semiconductor chip 500, arranged on the lower side of the optoelectronic semiconductor chip 500, and the respective anode section 210. A further electrical contact of the optoelectronic semiconductor chip 500, arranged on the upper side 501 of the respective optoelectronic semiconductor chip 500 electrically conductively connects by a bonding wire 510 to that part of the cathode section 220 of the respective section pair 230 exposed in the respective cavity 420. It is, however, also possible to arrange the optoelectronic semiconductor chips 500, in the cavities 420 of the molded body 400, and electrically conductively connect them to the respective anode section 210 and to the respective cathode section 220 of the respective section pair 230, of the lead frame 100, in another way.

After the optoelectronic semiconductor chips 500 have been arranged in the cavities 420 of the molded body 400 and the electrically conductive connections have been produced between the optoelectronic semiconductor chips 500 and the section pairs 230 of the lead frame 100, an encapsulation material may have been arranged in each cavity 420 of the molded body 400. In this case, the optoelectronic semiconductor chips 500 arranged in the cavities 420 and the bonding wires 510 arranged in the cavities 420 are embedded in the encapsulation material arranged in the respective cavities 420. The encapsulation material may, for example, comprise a silicone or another optically transparent material, and may be used to protect the respective optoelectronic semiconductor chip 500 and the respective bonding wire 510 from damage by external influences. The encapsulation material arranged in the cavities 420 of the molded body 400 may furthermore comprise embedded wavelength-converting particles configured to convert at least a part of the electromagnetic radiation emitted by the respective optoelectronic semiconductor chip 500 into electromagnetic radiation with a different wavelength. It is possible to omit the arrangement of encapsulation material in the cavities 420 of the molded body 400.

The bars 300 of the lead frame 100 that form resiliently deformable flexural springs allow size variation of the lead frame 100 in the plane of the lead frame 100. This makes it possible for the lead frame 100, after embedding the lead frame 100 in the molded body 400, to adapt to a possible size variation of the molded body 400. For example, the molded body 400 may experience shrinkage during cooling after formation of the molded body 400. By virtue of the fact that the lead frame 100 can at least partially adapt to the size decrease of the molded body 400, only small stresses between the lead frame 100 and the molded body 400 embedding the lead frame 100 occur during shrinkage of the molded body 400. This also only results in minor deformation and/or bending of the molded body 400 with the embedded lead frame 100.

It is also possible to configure the molded body 400 such that the upper side 101 of the lead frame 100 is not covered by the material of the molded body 400. The lower side of the lead frame 100 then preferably also remains uncovered by the material of the molded body 400. The material of the molded body 400 in this case fills only the openings of the lead frame 100 extending from the upper side 101 to the lower side of the lead frame 100. The molded body 400 formed in this way does not have cavities 420. After the formation of the molded body 400, the optoelectronic semiconductor chips 500 are arranged, as in the representation of FIG. 2, on the section pairs 230 at the crossing points of the columns 110, 120, 130 and the rows 140, 150 of the lead frame 100. An encapsulation material in which the optoelectronic semiconductor chips 500 and the bonding wires 510 are embedded may subsequently be arranged on the upper side 101 of the lead frame 100. The arrangement of the encapsulation material on the upper side 101 of the lead frame 100 may, for example, be carried out by a molding method.

Figure 3:
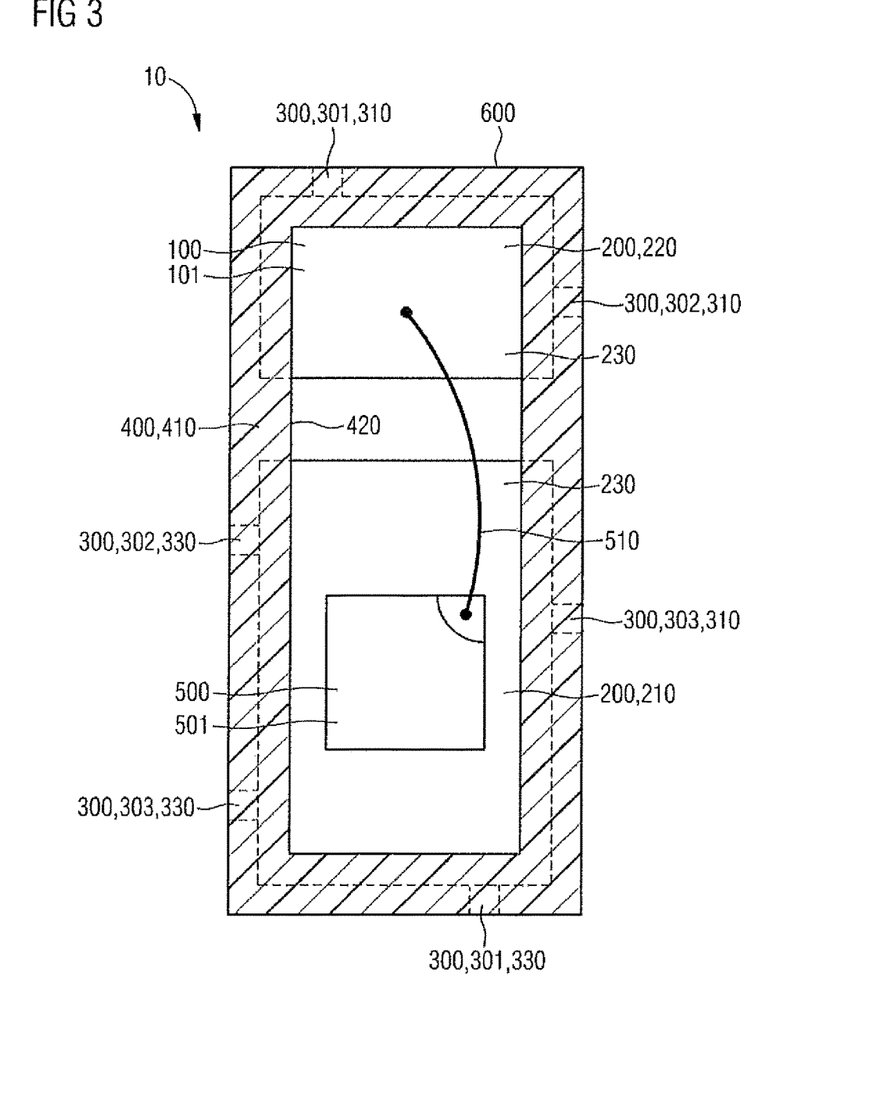
FIG. 3 schematically shows a plan view of a first optoelectronic component formed from the molded body.

In a processing step following the processing state represented in FIG. 2, the molded body 400 and the lead frame 100 embedded in the molded body 400 are divided to form individual chip packages 600 of individual first optoelectronic components 10. FIG. 3 shows a schematic representation of a plan view of one of the first optoelectronic components 10 formed in this way.

Division of the molded body 400 and the lead frame embedded in the molded body 400 is carried out along vertical separating planes 160, 165 and horizontal separating planes 170, 175. The vertical separating planes 160, 165 extend between the columns 110, 120, 130 of the lead frame 100. The horizontal separating planes 170, 175 extend between the rows 140, 150 of the lead frame 100. Between each two neighboring columns 110, 120, 130 of the lead frame 100, one of the first vertical separating plane 160 extends through the first longitudinal sections 310 of the second bars 300, 302 and third bars 300, 303 extending between these columns 110, 120, 130. The first vertical separating plane 160 is in this case oriented perpendicularly to the first longitudinal sections 310 of the bars 300, 302, 303 cut through on the first vertical separating plane 160. Between each two neighboring columns 110, 120, 130 of the lead frame 100, a second separating plane 165 furthermore extends through the third longitudinal sections 330 of the second bars 300, 302 and third bars 300, 303 extending between the two columns 110, 120, 130. The second vertical separating plane 165 is in this case oriented perpendicularly to the third longitudinal sections 330 of the bars 300, 302, 303 cut through on the second vertical separating plane 165. Between each two neighboring rows 140, 150 of the lead frame 100, one of the first horizontal separating planes 170 extends through the third longitudinal sections 330 of the first bars 300, 301 extending between these two parts 140, 150 of the lead frame 100, and is in this case oriented perpendicularly to the third longitudinal sections 330 of these bars 300, 301. Furthermore, one of the second horizontal separating planes 165 in each case extends between all the neighboring rows 140, 150 of the lead frame 100, through the first longitudinal sections 310 of the first bars 300, 301 extending between the respective rows 140, 150, and is in this case oriented perpendicularly to the first longitudinal sections 310 of these first bars 300, 301.

Cutting the molded body 400 and the bars 300 of the lead frame 100 embedded in the molded body 400 along the separating planes 160, 165, 170, 175 may, for example, be carried out by a sawing process. Since the bars 300 of the lead frame 100 are in this case respectively in a perpendicular direction in their first longitudinal sections 310 and their third longitudinal sections 330, only very minor burr formation in this case occurs in the region of the bars 300 so that there is also only a small risk of short circuit. Furthermore, the cutting edges of the bars 300 formed on the separating planes 160, 165, 170, 175 only have a minimal area because of the perpendicular cutting so that the corrosion sensitivity of the chip packages 600 formed in this way is minimized.

During cutting of the molded body 400 and the lead frame 100 embedded in the molded body 400, the parts respectively arranged between two associated vertical separating planes 160, 165 and those arranged respectively between two associated horizontal separating planes 170, 175 of the molded body 400 and the second longitudinal sections 320, embedded in these parts of the molded body 400, of the bars 300 of the lead frame 100 are removed.

The chip packages 600 formed by cutting the molded body 400 and the lead frame 100 embedded in the molded body 400 respectively comprise a molded body section 410 of the molded body 400 and a section pair 230, embedded in this molded body section 410, of lead frame sections 200 of the lead frame 100. The molded body section 410 of each chip package 600 comprises one of the cavities 420. The chip package 600 and the optoelectronic semiconductor chip 500 arranged in the cavity 420, and optionally embedded in an encapsulation material form the first optoelectronic component 10.

Each chip package 600 formed by the division of the molded body 400 and lead frame 100 comprises only parts of the first longitudinal sections 310 and the third longitudinal sections 330 of the bars 300 of the lead frame 100. No parts of the bars 300 therefore extend into that part of the molded body section 410 of the chip package 600 lying between the anode section 210 and the cathode section 220 of the section pair 230 of the chip package 600. In particular, no cutting surfaces of the bars 300 are exposed on the outer side edges of the molded body section 410 of the chip package 600 in this region of the molded body section 410. Advantageously, mechanical weakening of the molded body section 410 of the chip package 600 is therefore avoided in this region of the molded body section 410.

The first optoelectronic component 10 may, for example, be provided as an SMT component for surface mounting, for example, for surface mounting by reflow soldering. In this case, exposed sections of the lower side of the anode section 210 and the cathode section 220 of the chip package 600 exposed on the lower side of the chip package 600 of the first optoelectronic component 10 may be used as solder contact surfaces of the first optoelectronic component 10.

Figure 4:
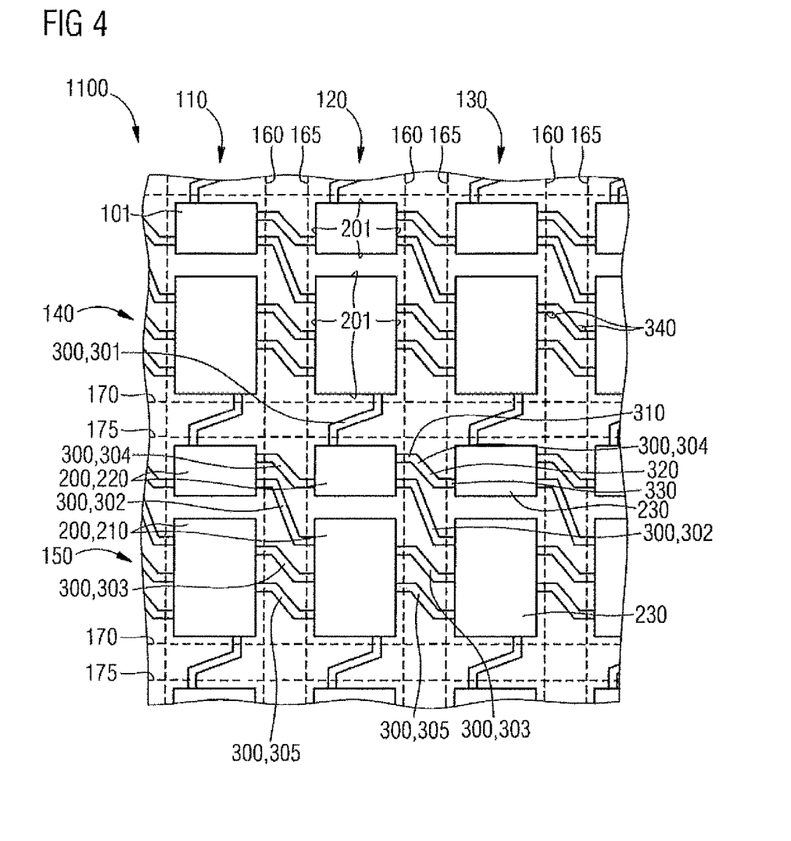
FIG. 4 schematically shows a plant view of a part of a further lead frame.

FIG. 4 shows a schematized representation of a plan view of a lead frame 1100. The lead frame 1100 has great similarities with the lead frame 100 of FIG. 1. Component parts of the lead frame 1100 corresponding to component parts existing in the lead frame 100 are provided with the same references in FIG. 4 as in FIG. 1. Only the differences between the lead frame 1100 of FIG. 4 and the lead frame 100 of FIG. 1 will be explained below. The lead frame 1100 may be used for production of a chip package 600 of a second optoelectronic component, in which case production may be carried out according to the method explained with the aid of FIGS. 1 to 3.

The lead frame 1100 differs from the lead frame 100 in that the lead frame 1100 also comprises fourth bars 300, 304 and fifth bars 300, 305 in addition to the first bars 300, 301, the second bars 300, 302 and the third bars 300, 303. The fourth bars 300, 304 respectively extend from the cathode section 220 of a section pair 230 to the cathode section 220 of a neighboring section pair 230. For example, one of the fourth bars 300, 304 extends from the cathode section 220 of the section pair 230 in the second column 120 and the second row 150 to the cathode section 220 of the section pair 230 in the third column 130 and the second row 150 of the lead frame 100. The first longitudinal section 310 of the fourth bar 300, 304 in this case adjoins one of the outer edges 201 of the cathode section 220 of the section pair 230 in the second column 120 perpendicularly, while the third longitudinal section 330 of the fourth bar 300, 304 adjoins one of the outer edges 201 of the cathode section 220 of the section pair 230 in the third column 130 perpendicularly.

The fifth bars 300, 305 extend parallel to the third bars 300, 303 and respectively connect the anode section 210 of a section pair 230 to the anode section 210 of a neighboring section pair 230. For example, one of the fifth bars 300, 305 connects the anode section 210 of the section pair 230 in the second column 120 and the second row 150 of the lead frame 100 to the anode section 210 of the section pair 230 in the third column 130 and the second row 150. The first longitudinal section 310 of this fifth bar 300, 305 in this case adjoins one of the outer edges 201 of the anode section 210 of the section pair 230 in the second column 120 perpendicularly. The third longitudinal section 330 of this fifth bar 300, 305 adjoins one of the outer edges 201 of the anode section 210 of the section pair 230 in the third column 130 of the lead frame 100 perpendicularly.

In the lead frame 1100, the fourth bars 300, 304 and the fifth bars 300, 305 are configured like the other bars 300 and, therefore, likewise act as resiliently deformable flexural springs. Because of the larger number of bars 300 of the lead frame 1100, however, the lead frame 1100 has a reduced elasticity and flexibility compared with the lead frame 100 and, therefore, has an increased mechanical stability compared to the lead frame 100. It is possible to configure the lead frame 1100 correspondingly with yet further bars 300 to further increase the stiffness of the lead frame 1100.

Figure 5:
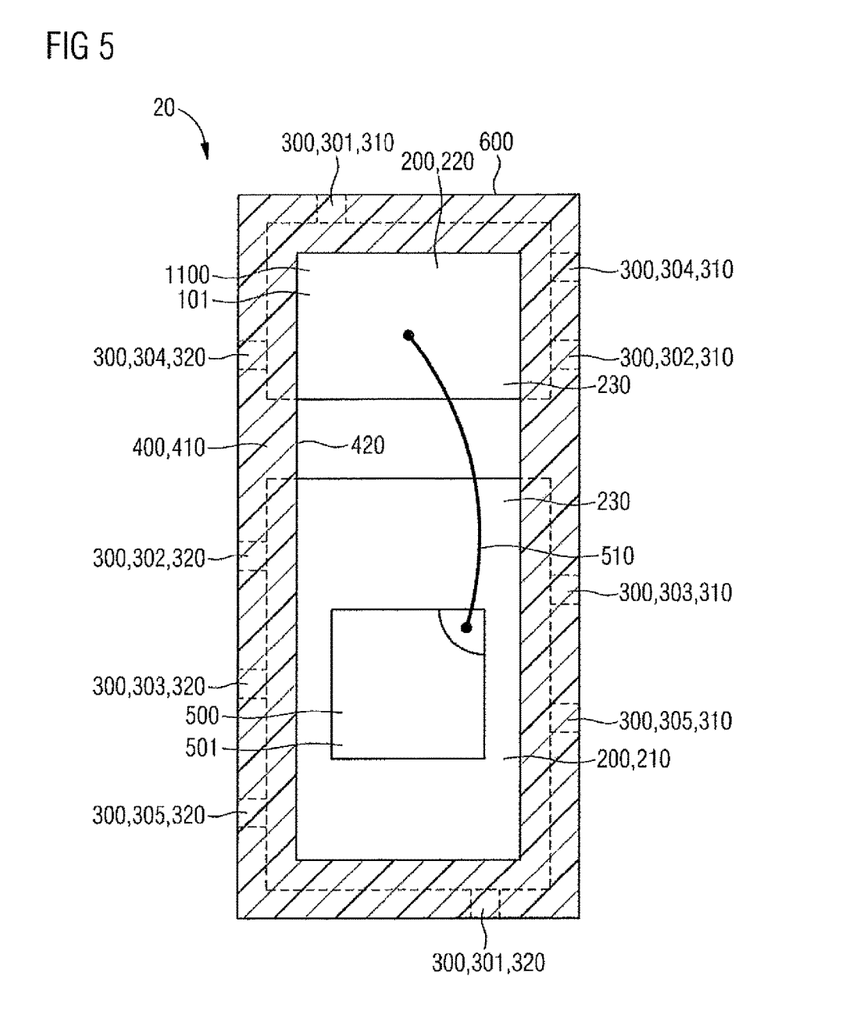
FIG. 5 schematically shows a plan view of a second optoelectronic component.

FIG. 5 shows a schematic plan view of a second optoelectronic component 20 comprising a chip package 600 having been produced from the lead frame 1100. The chip package 600 comprises only parts of the first longitudinal sections 310 and the third longitudinal sections 330 of the bars 300 adjoining the lead frame sections 200 of the section pair 230 embedded in the molded body section 410 of the chip package 600.

Our lead frames and methods have been illustrated and described in detail with the aid of preferred examples. This disclosure is not, however, restricted to the examples disclosed. Rather, other variants may be derived therefrom by those skilled in the art without departing from the protective scope of this disclosure and the appended claims.

This application claims priority of DE 10 2015 100 262.0, the subject matter of which is incorporated herein by reference.

The invention claimed is:

1. A lead frame used to produce a chip package comprising:
   a first lead frame section and a second lead frame section connected to one another by a bar,
   wherein the bar comprises a first longitudinal section, a second longitudinal section and a third longitudinal section,
   the first longitudinal section adjoins the first lead frame section and the third longitudinal section adjoins the second lead frame section,
   the first longitudinal section adjoins the second longitudinal section and the second longitudinal section adjoins the third longitudinal section,
   the first longitudinal section perpendicularly adjoins an outer edge of the first lead frame section,
   the third longitudinal section perpendicularly adjoins an outer edge of the second lead frame section,
   the first longitudinal section and the third longitudinal section are oriented parallel to one another,
   the first longitudinal section and the second longitudinal section form an angle not equal to 180° and not equal to 90°, and
   the lead frame is planar.

2. The lead frame according to claim 1,
   wherein the first lead frame section is connected by further bars to further lead frame sections,
   all the further bars respectively comprise a first longitudinal section, a second longitudinal section and a third longitudinal section,
   all the first longitudinal sections of the further bars adjoin the first lead frame section,
   the first longitudinal section and the third longitudinal section of each further bar are respectively oriented parallel to one another, and
   the first longitudinal section and the second longitudinal section of each further bar respectively form an angle not equal to 180°.

3. The lead frame according to claim 1, wherein the lead frame is provided for the production of a QFN chip package.

4. The lead frame according to claim 1, wherein the lead frame is provided for the production of a chip package for an optoelectronic component.

5. A method of producing a chip package comprising:
   providing the lead frame according to claim 1;
   embedding the lead frame in a molded body; and
   dividing the molded body and the lead frame, the bar being cut through.

6. The method according to claim 5, wherein the bar is cut through in the first longitudinal section and/or in the third longitudinal section.

7. The method according to claim 5, wherein the bar is cut through in a direction oriented perpendicularly to the first longitudinal section of the bar.

8. A method of producing an optoelectronic component comprising:
   producing a chip package by the method according to claim 5; and
   arranging an optoelectronic semiconductor chip on a section of the lead frame.

\* \* \* \* \*